(12) United States Patent
Kimishima et al.

(10) Patent No.: US 11,871,515 B2
(45) Date of Patent: Jan. 9, 2024

(54) WIRING SUBSTRATE

(71) Applicant: IBIDEN CO., LTD., Gifu (JP)

(72) Inventors: Yasuki Kimishima, Ogaki (JP); Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 29 days.

(21) Appl. No.: 17/488,373

(22) Filed: Sep. 29, 2021

(65) Prior Publication Data

US 2022/0104353 A1    Mar. 31, 2022

(30) Foreign Application Priority Data

Sep. 30, 2020 (JP) ................. 2020-165374

(51) Int. Cl.
*H05K 1/11* (2006.01)
*H05K 1/16* (2006.01)
*H05K 1/02* (2006.01)

(52) U.S. Cl.
CPC ........... *H05K 1/115* (2013.01); *H05K 1/0298* (2013.01); *H05K 1/111* (2013.01); *H05K 1/116* (2013.01); *H05K 1/165* (2013.01)

(58) Field of Classification Search
CPC ...... H05K 1/115; H05K 1/0298; H05K 1/116; H05K 3/427; H05K 1/165; H05K 2201/086; H05K 3/4602; H05K 2201/0959; H01L 23/49827; H01L 23/49822; H01L 21/486
See application file for complete search history.

(56) References Cited

U.S. PATENT DOCUMENTS

| 8,367,943 | B2* | 2/2013 | Wu .................. H05K 1/115 174/262 |
| 2019/0279806 | A1* | 9/2019 | Darmawikarta .... H01F 27/2804 |
| 2019/0373732 | A1* | 12/2019 | Taniguchi .............. H05K 1/185 |
| 2019/0385777 | A1* | 12/2019 | Kodama ................. H01F 27/24 |
| 2020/0258975 | A1* | 8/2020 | Shanmugam ........... H01L 28/10 |

FOREIGN PATENT DOCUMENTS

JP     2014-039073 A    2/2014

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes an insulating layer having a through hole, a first conductor layer formed on a first surface of the insulating layer, a second conductor layer formed on a second surface of the insulating layer, an interlayer connection conductor formed in the through hole such that the interlayer connection conductor is connecting the first and second conductor layers, and a resin body formed in the through hole of the insulating layer such that a volume occupancy rate of the resin body is in a range of 30% to 55% in the through hole. The interlayer connection conductor is formed such that the interlayer connection conductor has a length in a range of 1000 μm to 2000 μm in a thickness direction of the insulating layer and that a volume occupancy rate of the interlayer connection conductor is in a range of 45% to 70% in the through hole.

20 Claims, 7 Drawing Sheets

WIRING SUBSTRATE

CROSS-REFERENCE TO RELATED APPLICATIONS

The present application is based upon and claims the benefit of priority to Japanese Patent Application No. 2020-165374, filed Sep. 30, 2020, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-39073 describes a wiring substrate having an insulating base that includes a core insulating plate. In the core insulating plate, a through hole that connects to each other wiring conductors formed on both sides of the core insulating plate is formed, and the through hole is filled with a filling resin. The entire contents of this publication are incorporated herein by reference.

SUMMARY OF THE INVENTION

According to one aspect of the present invention, a wiring substrate includes an insulating layer having a through hole, a first conductor layer formed on a first surface of the insulating layer, a second conductor layer formed on a second surface of the insulating layer on the opposite side with respect to the first surface of the insulating layer, an interlayer connection conductor formed in the through hole such that the interlayer connection conductor is connecting the first and second conductor layers, and a resin body formed in the through hole of the insulating layer such that a volume occupancy rate of the resin body is in a range of 30% to 55% in the through hole. The interlayer connection conductor is formed such that the interlayer connection conductor has a length in a range of 1000 μm to 2000 μm in a thickness direction of the insulating layer and that a volume occupancy rate of the interlayer connection conductor is in a range of 45% to 70% in the through hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
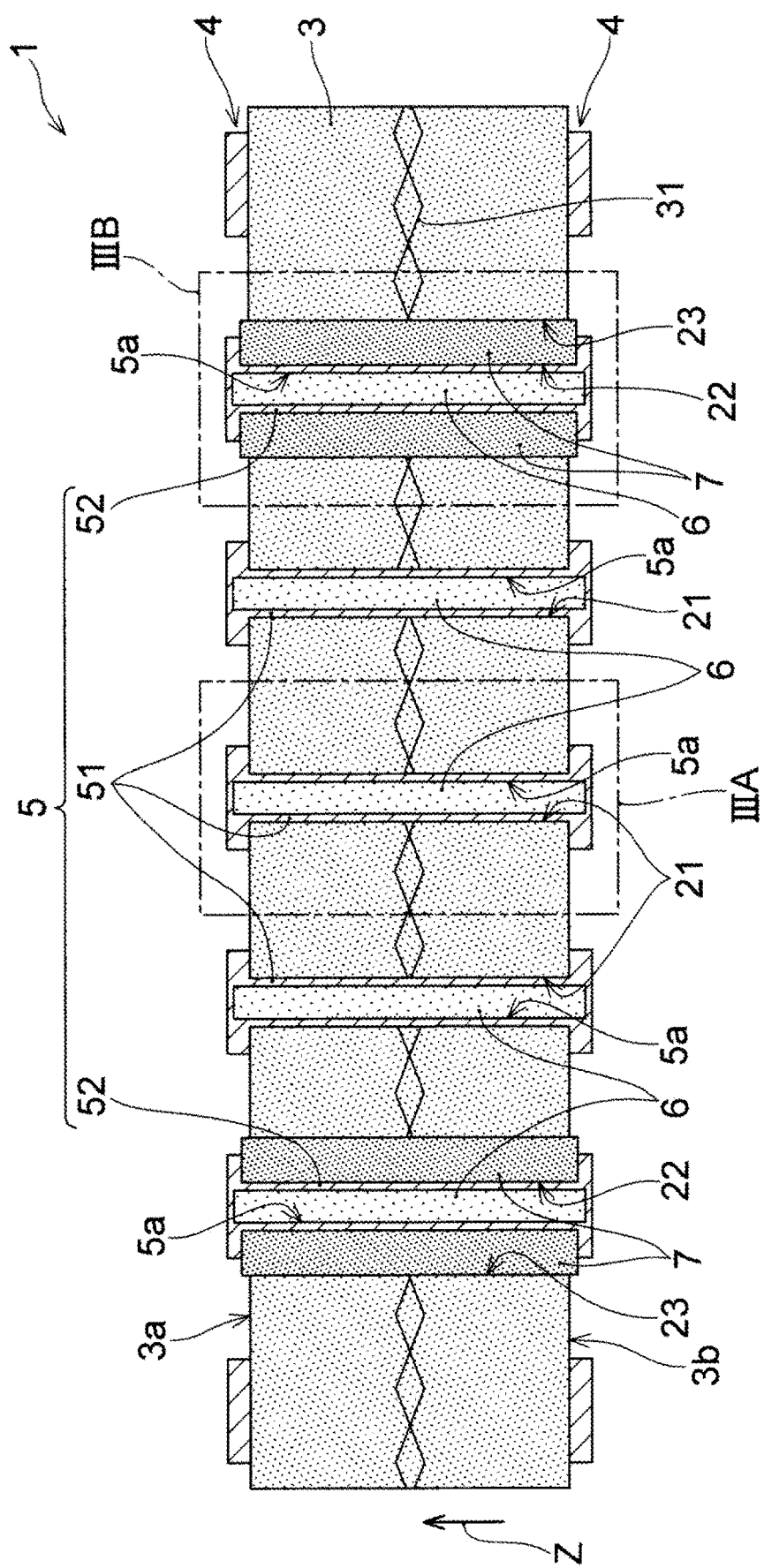
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
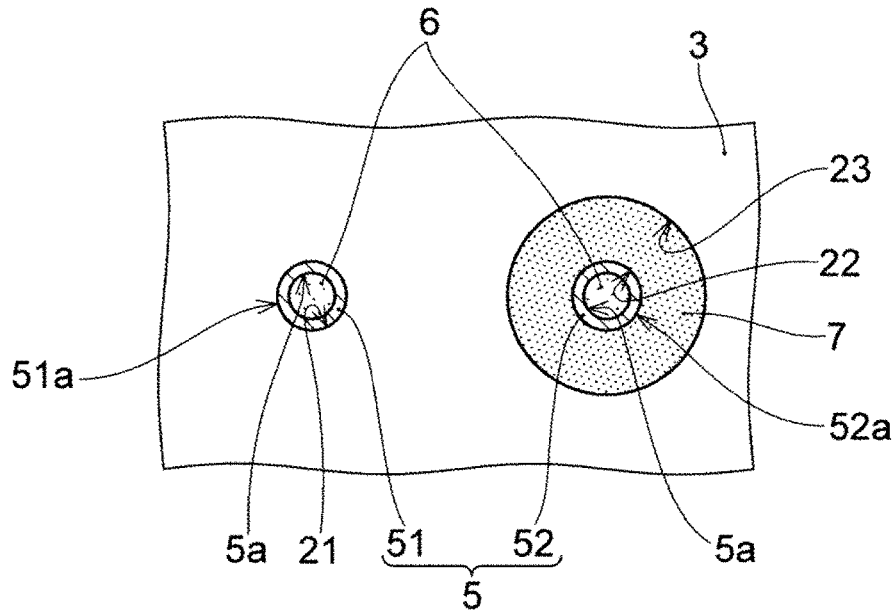
FIG. 2 is a cross-sectional view of two interlayer connection conductors according to an embodiment of the present invention in a plane orthogonal to an axial direction of the interlayer connection conductors.

A wiring substrate of an embodiment of the present invention is described with reference to the drawings. FIG. 1 is a cross-sectional view illustrating a wiring substrate 1 which is an example of the wiring substrate of the embodiment. FIG. 2 illustrates a cross-sectional view of first and second interlayer connection conductors (51, 52) in a plane orthogonal to a thickness direction of an insulating layer 3.

As illustrated in FIG. 1, the wiring substrate 1 of the present embodiment includes an insulating layer 3, two conductor layers 4 opposing each other via the insulating layer 3, and one or more interlayer connection conductors 5 connecting the two conductor layers 4 to each other. The wiring substrate 1 in the example of FIG. 1 includes, as the one or more interlayer connection conductors 5, multiple interlayer connection conductors including the first interlayer connection conductors 51 and the second interlayer connection conductors 52. First interlayer connection conductors 51 are formed inside first through holes 21. The second interlayer connection conductors 52 are formed inside second through holes 22. The first through holes 21 and the second through holes 22 each penetrate the insulating layer 3 along the thickness direction of the insulating layer 3 (hereinafter, the thickness direction of the insulating layer 3 is also simply referred to as a "Z direction"). The interlayer connection conductors 5 are through-hole conductors that connect to each other the conductor layers 4 that are respectively formed on two main surfaces (a first surface (3a) and a second surface (3b)) of the insulating layer 3 orthogonal to the Z direction.

The insulating layer 3 is formed of any insulating resin. Examples of the insulating resin include an epoxy resin, a bismaleimide triazine resin (BT resin), a phenol resin, and the like. The insulating layer 3 formed using these insulating resins may contain an inorganic filler such as silica. In the example of FIG. 1, the insulating layer 3 contains, for example, a reinforcing material 31 formed of a glass fiber, an aramid fiber, or the like.

The wiring substrate 1 further includes resin bodies 6 that are filled in the first through holes 21 and the second through holes 22. The resin bodies 6 are filled in regions that are not occupied by the interlayer connection conductors 5 in the first through holes 21 and the second through holes 22.

The wiring substrate 1 in the example of FIG. 1 further includes magnetic bodies 7 that penetrate the insulating layer 3 along the Z direction. In the example of FIG. 1, the second interlayer connection conductors 52 respectively penetrate the magnetic bodies 7, and therefore the second through holes 22 also respectively penetrate the magnetic bodies 7. The second interlayer connection conductors 52 and the second through holes 22 penetrate the insulating layer 3 via the magnetic bodies 7. On the other hand, the first interlayer connection conductors 51 penetrate the insulating layer 3, and therefore the first through holes 21 also penetrate the insulating layer 3. As described above, the first through holes 21 and the second through holes 22 each penetrate the insulating layer 3 along the Z direction. That the through holes (or the interlayer connection conductors) "penetrate" the insulating layer 3 also includes penetrating the insulating layer 3 via inclusions such as the magnetic bodies 7 as in the case of the second through holes 22, in addition to directly penetrating the insulating layer 3 as in the case of the first through holes 21.

Specifically, as illustrated in FIGS. 1 and 2, the insulating layer 3 has the first through holes 21 and third through holes 23 that penetrate the insulating layer 3 in the Z direction. The first interlayer connection conductors 51 are formed on inner walls of the first through holes 21. Therefore, the first interlayer connection conductors 51 have outer peripheral side surfaces (51a) that are along the Z direction and are covered by the insulating layer 3, and the outer peripheral side surfaces (51a) are in contact with the inner walls of the first through holes 21, that is, in contact with the insulating layer 3.

On the other hand, the magnetic bodies 7 are filled in the third through holes 23, and the second through holes 22 penetrating the magnetic bodies 7 along the Z direction are formed in the magnetic bodies 7. The second interlayer connection conductors 52 are formed on inner walls of the second through holes 22. Therefore, the second interlayer connection conductors 52 have outer peripheral side surfaces (52a) that are covered by the magnetic bodies 7 and are along the Z direction, and the outer peripheral side surfaces (52a) are in contact with the inner walls of the second through holes 22, that is, in contact with the magnetic bodies 7.

In this way, in the example of FIG. 1, the first interlayer connection conductors 51 and the second interlayer connection conductors 52 are formed along the inner walls of the first through holes 21 or the second through holes 22, and each have a tubular shape. Therefore, the wiring substrate 1 have hollow parts (5a) that penetrate the first interlayer connection conductors 51 or the second interlayer connection conductors 52 in the Z direction, and the hollow parts (5a) are filled with the resin bodies 6.

As illustrated in FIG. 2, the interlayer connection conductors 5, the resin bodies 6, and the magnetic bodies 7 each have a substantially circular shape in a cross section orthogonal to the Z direction. Therefore, in the example of FIGS. 1 and 2, the interlayer connection conductors 5, the resin bodies 6, and the magnetic bodies 7 each have a cylindrical or tubular shape. However, in the present embodiment, the interlayer connection conductors 5, the resin bodies 6, and the magnetic bodies 7 may each be a columnar or tubular body having any cross-sectional shape.

Figure 3A:
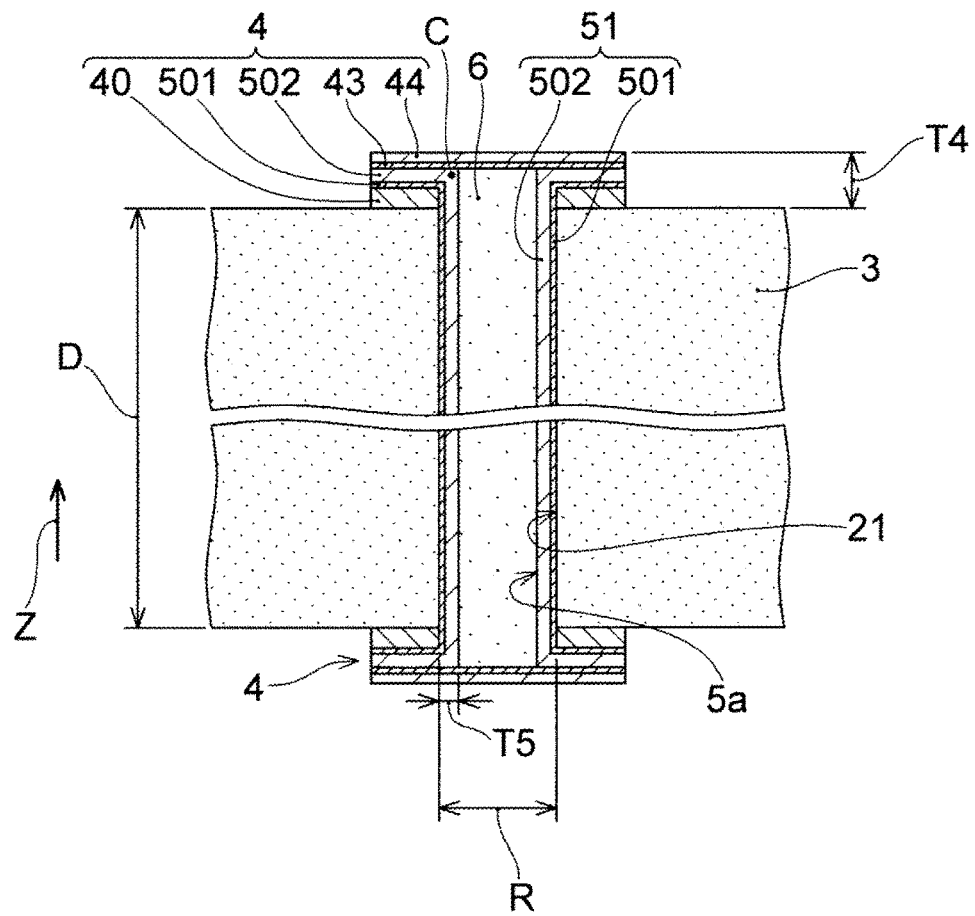
FIG. 3A is an enlarged view of a portion (IIIA) of FIG. 1.
Figure 3B:
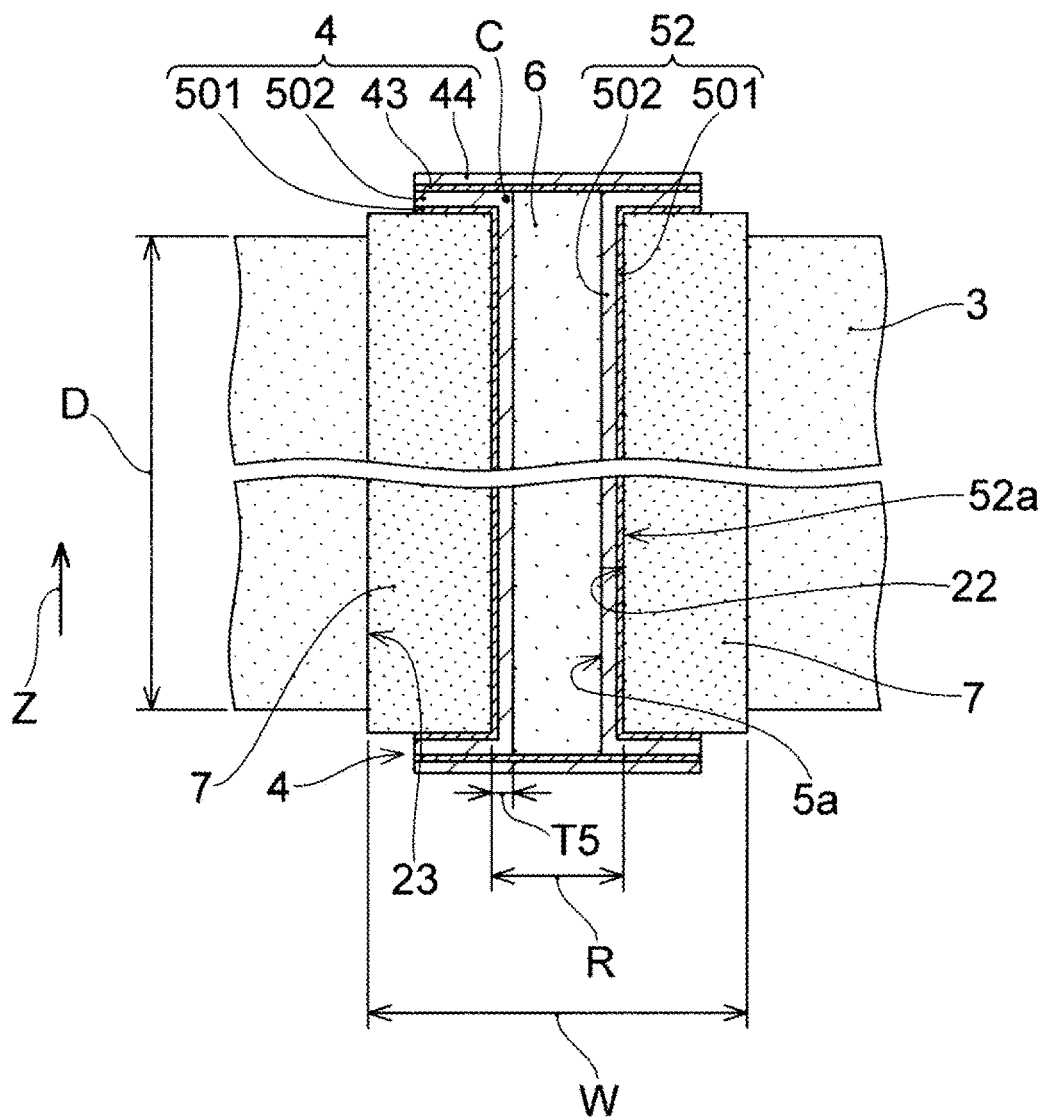
FIG. 3B is an enlarged view of a portion (IIIB) of FIG. 1.

FIGS. 3A and 3B are respectively enlarged views of a portion (IIIA) and a portion (IIIB) of FIG. 1. That is, FIGS. 3A and 3B respectively illustrate enlarged views of a first interlayer connection conductor 51 and a second interlayer connection conductor 52.

As illustrated in FIGS. 3A and 3B, the first interlayer connection conductors 51 and the second interlayer connection conductors 52 each include a first metal film 501, and a second metal film 502 formed on the first metal film 501. In this way, the interlayer connection conductors (51, 52) are formed by metal films (the first metal film 501 and the second metal film 502) formed on the inner walls of the first through holes 21 or the second through holes 22. The second metal film 502 is, for example, a plating film formed by electrolytic plating. The first metal film 501 functions as a power feeding layer and/or a seed layer when the second metal film 502 is formed by electrolytic plating. The first metal film 501 is formed by, for example, electroless plating or sputtering. However, it is also possible that the first and second interlayer connection conductors (51, 52) each contain only a metal film formed by electroless plating. Examples of a material forming the interlayer connection conductors (51, 52) include mainly copper, nickel, and the like. However, the material of the interlayer connection conductors (51, 52) is not limited to these.

Both end parts in the Z direction of each of the first interlayer connection conductors 51 and the second interlayer connection conductors 52 are covered by a third metal film 43 and a fourth metal film 44. The third metal film 43 and the fourth metal film 44 are so-called lid plating films for the interlayer connection conductors. Since the third metal film 43 and the fourth metal film 44 are formed, as will be described later, when the insulating layer 3 is used as a part of a multilayer wiring substrate, it may be possible that the interlayer connection conductors can be electrically connected to via conductors directly formed on the interlayer connection conductors. Similar to the first metal film 501, the third metal film 43 is formed by electroless plating or sputtering. Similar to the second metal film 502, the fourth metal film 44 is formed by electrolytic plating. The third metal film 43 and the fourth metal film 44 are formed of, for example, a metal such as copper or nickel.

As illustrated in FIG. 3A, in the wiring substrate 1, the two conductor layers 4 opposing each other via the insulating layer 3 can each have a five-layer structure. That is, the conductor layers 4 are each formed by a metal foil 40, the first metal film 501 on the metal foil 40, the second metal film 502 on the first metal film 501, the third metal film 43 on the second metal film 502, and the fourth metal film 44 on the third metal film 43. The metal foil 40 is formed of any metal. For example, the metal foil 40 is a copper foil or a nickel foil. On the other hand, on the magnetic bodies 7, as illustrated in FIG. 3B, the conductor layers 4 can each have a four-layer structure including the first metal film 501, the second metal film 502, the third metal film 43, and the fourth metal film 44.

The first metal film 501 and the second metal film 502 each include a portion that forms the first interlayer connection conductors 51 or the second interlayer connection conductors 52, and a portion that forms the conductor layers 4, and the two portions are integrally formed. That is, with respect to the first metal film 501 and the second metal film 502, the first and second interlayer connection conductors (51, 52) are each integrally formed with the two conductor layers 4. Therefore, it is considered that peeling between each of the first and second interlayer connection conductors (51, 52) and each of the two conductor layers 4 is unlikely to occur.

A material of the resin bodies 6 is not particularly limited as long as the material can fill the hollow parts (5a). The resin bodies 6 can contain, for example, an insulating resin such as an epoxy resin, an acrylic resin, or a phenol resin. Further, the material of the resin bodies 6 may contain a conductive resin that contains conductive particles such as silver particles and an epoxy resin or the like. The resin bodies 6 preferably contain a material that has a thermal expansion coefficient close to that of the insulating layer 3 formed of an epoxy resin or the like.

When the entire interior of each of the first and second through holes (21, 22) illustrated in FIGS. 3A and 3B is filled with the first and second metal films (501, 502), the conductor layers 4 including the first and second metal films (501, 502) may be thicker than desired. In this case, it may be difficult to provide wiring patterns (fine pitch patterns) formed at a fine pitch in the conductor layers 4 using a simple method such as etching. Therefore, in the present embodiment, the first and second metal films (501, 502) forming the first interlayer connection conductors 51 or the second interlayer connection conductors 52 are not formed throughout the interior of each of the first and second through holes (21, 22).

Then, in the through holes, regions that are not occupied by the interlayer connection conductors are filled with the resin bodies 6 containing, for example, an epoxy resin or the like. Since free spaces in the through holes are filled, when the insulating layer 3 is used as a part of a multilayer wiring substrate as in another embodiment to be described later, via conductors can be formed directly on the interlayer connection conductors. The resin bodies 6 containing various resin materials are more likely to have a thermal expansion coefficient closer to that of the insulating layer 3 than a metal such as copper forming the metal films, and for example, it may be possible that a thermal stress is reduced.

On the other hand, when the resin bodies 6 are formed of an epoxy resin or the like, the resin bodies 6 can be insulators. Even when the resin bodies 6 contain conductive particles, the resin bodies 6 can have a lower conductivity than the material of the first and second interlayer connection conductors (51, 52). Therefore, in a conventional wiring substrate, an electrical resistance between two conductor layers connected by interlayer connection conductors such as through-hole conductors may be larger than a desired resistance value. In this case, it is possible that, when the two conductor layers are energized, an excessive voltage drop or heat generation occurs, so that desired characteristics of the wiring substrate are not obtained or disconnection of the through-hole conductors occurs.

Therefore, in the present embodiment, the interlayer connection conductors and the resin bodies 6 are provided such that the conductor layers 4 can have fine pitch patterns and desired characteristics or reliability can be obtained. Specifically, the interlayer connection conductors (51, 52) and the resin bodies 6 are formed so as to have predetermined volume occupancy rates with respect to the through holes (21, 22).

First, the interlayer connection conductors (51, 52) have a volume occupancy rate of 45% or more and 70% or less as a volume occupancy rate of the interlayer connection conductors (51, 52) in the through holes (21, 22) (hereinafter, this volume occupancy rate is also simply referred to as a "volume occupancy rate ($\alpha$)"). The interlayer connection conductors (51, 52) preferably can have a volume occupancy rate of 50% or more as the volume occupancy rate ($\alpha$). Specifically, the volume occupancy rate of the first interlayer connection conductors 51 in the first through holes 21 and the volume occupancy rate of the second interlayer connection conductors 52 in the second through holes 22 are both 45% or more and 70% or less.

On the other hand, in the present embodiment, the resin bodies 6 have a volume occupancy rate of 30% or more and 55% or less as a volume occupancy rate of the resin bodies 6 in the through holes (21, 22) (hereinafter, this volume occupancy rate is also simply referred to as a "volume occupancy rate ($\beta$)"). The resin bodies 6 preferably can have a volume occupancy rate of 30% or more and 50% or less as the volume occupancy rate ($\beta$). In other words, the volume occupancy rate of the resin bodies 6 in the first through holes 21 and the second through holes 22 is 30% or more and 55% or less.

In the present embodiment, the first and second interlayer connection conductors (51, 52) and the resin bodies 6 are structured to have the above-described volume occupancy rates in the through holes. Therefore, it may be possible to avoid an excessively large electrical resistance between the two conductor layers 4 while avoiding excessively large thicknesses of the two conductor layers 4. Therefore, it may be possible to obtain favorable values for both the thicknesses of the conductor layers 4 and the electrical resistance between the conductor layers 4.

In the present embodiment, the insulating layer 3 interposed between the two conductor layers 4 has a thickness of 1000 µm or more. That is, the first interlayer connection conductors 51 and the second interlayer connection conductors 52 each have a length of 1000 µm or more in the Z direction. An electrical resistance between two ends of each of the interlayer connection conductors in the Z direction increases as a length (D) of each of the interlayer connection conductors in the Z direction increases. In particular, when the interlayer connection conductors each have a length of 1000 µm or more in the Z direction, the electrical resistance between the two ends of each of the interlayer connection conductors in the Z direction is likely to become excessively large. However, in the present embodiment, since the first and second interlayer connection conductors (51, 52) and the resin bodies 6 are structured to have the above-described volume occupancy rates in the through holes, an increase in the electrical resistance between the two ends of each of the interlayer connection conductors is likely to be suppressed. It is considered that the present embodiment is particularly beneficial for a wiring substrate having an insulating layer having a thickness of 1000 µm or more.

However, when the length (D) of each of the interlayer connection conductors in the Z direction is significantly large, the electrical resistance between the two conductor layers 4 may exceed a desired value. Therefore, it may be preferable that the length (D) of each of the interlayer connection conductors (51, 52) in the Z direction, that is, the thickness of the insulating layer 3, is 2000 µm or less.

In the example of FIG. 3A, each of the conductor layers 4 each including the first and second metal films (501, 502) and metal foil 40 has a thickness (T4) of, for example, 35 µm or more and 50 µm or less. When the conductor layers 4 each have a thickness in this range, it may be possible that a desired fine pitch pattern and a conductor pattern having a desired current rating can coexist in each of the conductor layers 4.

When the volume occupancy rate ($\alpha$) of the interlayer connection conductors (51, 52) is 45% or more, the volume occupancy rate ($\beta$) of the resin bodies 6 is 55% or less, and the thickness of the insulating layer 3 is 2000 μm or less, it may be possible that a current of several tens of amperes or more can be applied to each of the interlayer connection conductors (51, 52) without significant temperature rise and/or voltage drop. Preferably, an inner diameter (R) of each of the first and second through holes (21, 22) and/or a thickness (T5) of the metal films (a sum of a thickness of the first metal film 501 and a thickness of the second metal film 502) forming the interlayer connection conductors (51, 52) are adjusted such that a current of this magnitude can be applied.

When the volume occupancy rate ($\alpha$) of the interlayer connection conductors (51, 52) is 70% or less and the volume occupancy rate ($\beta$) of the resin bodies 6 is 30% or more, it may be possible that a fine pitch pattern can be formed according to a wiring rule of (60 μm)/(60 μm) ((wiring width)/(wiring interval)) in each of the conductor layers 4. Preferably, the inner diameter (R) of each of the through holes, the thickness (T5) of the metal films forming the interlayer connection conductors (51, 52), and the thicknesses of the metal foil 40 and the third and fourth metal films (43, 44), are adjusted such that such a wiring rule can be applied.

In the present embodiment, the inner diameter (R) of each of the first and second through holes (21, 22) is, for example, 120 μm or more and 190 μm or less. Although the term "inner diameter" is used for convenience, a planar shape (a cross-sectional shape in a plane orthogonal to the Z direction) of each of the first and second through holes (21, 22) and the third through holes 23 is not limited to a circular shape. The "inner diameter" of each of the first—third through holes (21, 22, 23) is a maximum distance between two points on an outer periphery of the planar shape of the each of the through holes.

Further, in the present embodiment, the thickness (T5) of the metal films forming the first and second interlayer connection conductors (51, 52) is, for example, 25 μm or more and 40 μm or less. The first and second interlayer connection conductors (51, 52) having such a thickness (T5) may contribute to improvement in heat conductivity via the interlayer connection conductors and may contribute to improvement in heat dissipation of the wiring substrate as compared to through holes or the like in a conventional wiring substrate. Further, in the interlayer connection conductors (51, 52) having such a thickness (T5), in bent portions (C), which are connecting portions between the interlayer connection conductors (51, 52) and the two conductor layers 4, it is considered that disconnection is unlikely to occur as a compared to a conventional wiring substrate.

When the inner diameter (R) of the first and second through holes (21, 22) and the thickness (T5) of the metal films forming the first and second interlayer connection conductors (51, 52) have the values exemplified above, the first and second interlayer connection conductors (51, 52) are likely to have the above-described volume occupancy rate ($\alpha$) of 45% or more and 70% or less. In other words, the resin bodies 6 are likely to have the above-described volume occupancy rate ($\beta$) of 30% or more and 55% or less.

A laminated structure of each of the conductor layers 4 is not limited to a five-layer structure or a four-layer structure as illustrated in FIGS. 3A and 3B. The conductor layers 4 each can have any number of layers. For example, it is not always necessary to form the third metal film 43 and the fourth metal film 44. Further, it is not always necessary to provide the metal foil 40.

As illustrated in FIG. 3B, the magnetic bodies 7 are filled in the third through holes 23 and cover the outer peripheral side surfaces (52a) of the second interlayer connection conductors 52 along the Z direction. The magnetic bodies 7 are interposed between the inner walls of the third through holes 23 and the second interlayer connection conductors 52. Since the second interlayer connection conductors 52 penetrate the magnetic bodies 7, a large magnetic flux density can be generated around the second interlayer connection conductors 52. Therefore, it is considered that an inductor having a high inductance can be formed in the wiring substrate 1 using the second interlayer connection conductors 52. A width (W) of each of the magnetic bodies 7 in a direction orthogonal to the Z direction, that is, an inner diameter of each of the third through holes 23 is, for example, 350 μm or more and 450 μm or less. For example, it is considered that a magnetic flux density can be efficiently increased around each of the second interlayer connection conductors 52 formed in the second through holes 22 that each have the inner diameter (R) of 120 μm or more and 190 μm or less.

The magnetic bodies 7 contain at least a material that is more easily magnetized than the insulating layer 3. The magnetic bodies 7 contain a ferromagnetic material such as iron, iron oxide, cobalt, or nickel. The magnetic bodies 7 may contain a resin material such as an epoxy resin or a urethane resin in addition to the ferromagnetic material.

The wiring substrate 1 illustrated in FIG. 1 and the like has the first interlayer connection conductors 51 and the second interlayer connection conductors 52. However, it is also possible that the wiring substrate of the embodiment has only the first interlayer connection conductors 51 that do not penetrate the magnetic bodies 7, or has only the second interlayer connection conductors 52 that penetrate the magnetic bodies 7.

Figure 4:
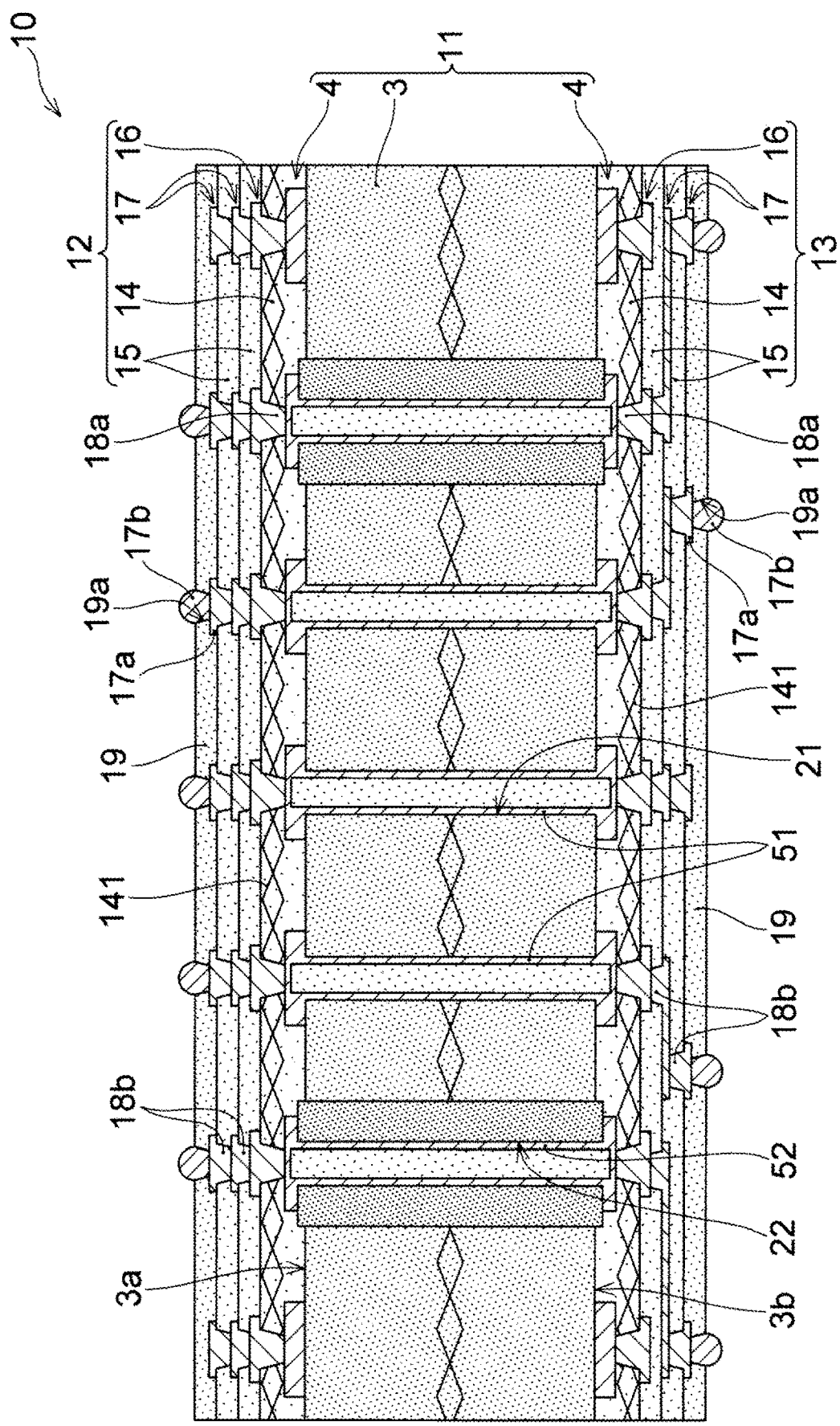
FIG. 4 is a cross-sectional view illustrating an example of a wiring substrate according to another embodiment of the present invention.

Next, another embodiment of the present invention is described with reference to FIG. 4. FIG. 4 illustrates a wiring substrate 10, which is an example of the another embodiment. As illustrated in FIG. 4, the wiring substrate 10 is a multilayer wiring substrate including a core substrate 11, a build-up layer 12, and a build-up layer 13. The core substrate 11 is formed by the insulating layer 3 and the two conductor layers 4 of the wiring substrate 1 of the embodiment illustrated in FIG. 1. The build-up layer 12 is formed on the first surface (3a) of the insulating layer 3, and the build-up layer 13 is formed on the second surface (3b) of the insulating layer 3. The build-up layer 12 and the build-up layer 13 each include one or more pairs of insulating layers and conductor layers, which are laminated on the core substrate 11.

In the example of FIG. 4, the build-up layer 12 includes an insulating layer 14 laminated on the first surface (3a) of the insulating layer 3, a conductor layer 16 formed on the insulating layer 14, and two insulating layers 15 and two conductor layers 17 that are alternately laminated on the insulating layer 14 and the conductor layer 16. The build-up layer 13 includes an insulating layer 14 laminated on the second surface (3b) of the insulating layer 3, a conductor layer 16, formed on the insulating layer 14, and two insulating layers 15 and two conductor layers 17 that are alternately laminated on the insulating layer 14 and the conductor layer 16.

In the description of the wiring substrate 10 of the present embodiment, a side farther from the core substrate 11 in a thickness direction of the wiring substrate 10 is also referred to as an "upper side" or simply "upper," and a side closer to the core substrate 11 is also referred to as a "lower side" or simply "lower." Further, for the conductor layers and the insulating layers, a surface facing the opposite side with respect to the core substrate 11 is also referred to as an "upper surface," and a surface facing the core substrate 11 is also referred to as a "lower surface."

In the wiring substrate 10, further, solder resist layers 19 are respectively formed on the first build-up layer 12 and the second build-up layer 13. In the solder resists 19, openings (19a) are provided that each expose a portion of the outermost conductor layers 17 of the build-up layers (12, 13). Bumps (17b) are respectively formed in the openings (19a), for example, using a conductive material such as solder.

Further, in the insulating layer 14 of each of the build-up layers (12, 13), via conductors (18a) penetrating the insulating layer 14 are formed. The via conductors (18a) connect to each other the conductor layer 4 and the conductor layer 16 that sandwich the insulating layer 14. Further, in each insulating layer 15 of each of the build-up layers (12, 13), via conductors (18b) penetrating the insulating layer 15 are formed. The via conductors (18b) connect to each other the conductor layers 17 that sandwich the insulating layer 15 or connect to each other the conductor layer 16 and the conductor layer 17 that sandwich the insulating layer 15.

Similar to the insulating layer 3, the insulating layers 14 and the insulating layers 15 are formed of any insulating resin. Examples of the insulating resin include an epoxy resin, a bismaleimide triazine resin (BT resin), a phenol resin, and the like. The insulating layers (14, 15) may each contain inorganic filler such as silica, and may each contain a woven fabric or non-woven fabric reinforcing material formed of a glass fiber, an aramid fiber, or the like. In the example of FIG. 4, the insulating layers 14 each contain a reinforcing material 141.

Similar to the conductor layers 4, the conductor layers (16, 17) are formed of any metal such as copper or nickel. The conductor layers (16, 17) can each have a multilayer structure that includes a metal foil, an electroless plating film or a sputtering film, and/or an electrolytic plating film, and the like. Further, the conductor layers (16, 17) can each include any conductor pattern. The outermost conductor layers 17 of the build-up layers (12, 13) include connection pads (17a) to which an external electronic component or a wiring substrate is connected. The openings (19a) are provided in the solder resist layers 19 to respectively expose the connection pads (17a), and the bumps (17b) are respectively formed on the connection pads (17a).

Each of the via conductors (18a, 18b) is integrally formed with the conductor layer 16 or conductor layer 17 on an upper side thereof, and is formed, for example, by an electroless plating film and an electrolytic plating film. In the example of FIG. 4, some of the via conductors (18a) are laminated on the through-hole conductors (the first interlayer connection conductors 51 or the second interlayer connection conductors 52) of the core substrate 11.

As in the example of FIG. 4, the insulating layer 3 that includes the first interlayer connection conductors 51 and/or the second interlayer connection conductors 52 in the through holes (the first through holes 21 or the second through holes 22) may form a core substrate of a multilayer wiring substrate. Less than or more than three pairs of insulating layers and conductor layers may be laminated on both sides of the core substrate 11, which is formed by the insulating layer 3 and the two conductor layers 4.

Next, an example of a method for manufacturing the wiring substrate 1 of FIG. 1 is described with reference to FIGS. 5A-5G.

Figure 5A:
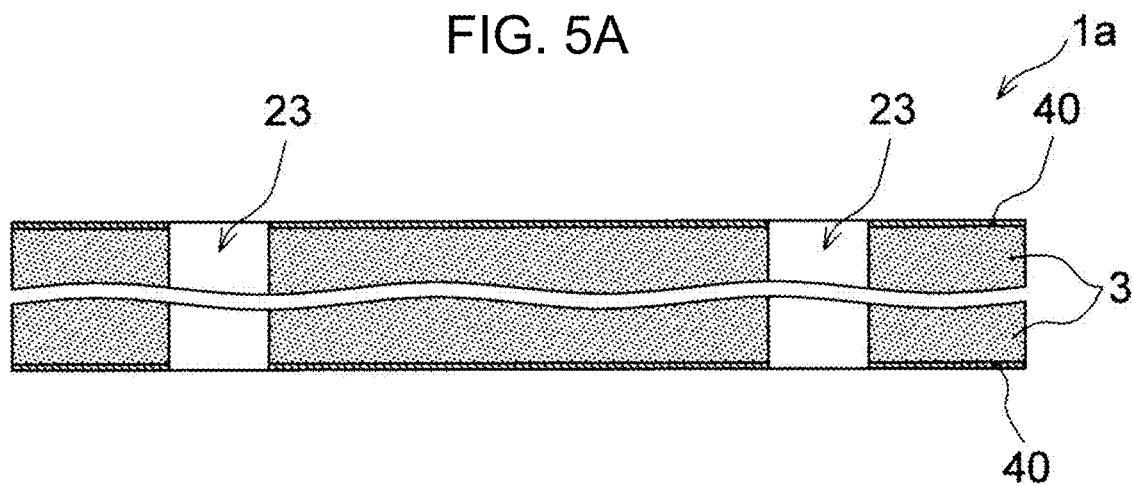
FIG. 5A is a cross-sectional view illustrating an example of a manufacturing process of a wiring substrate according to an embodiment of the present invention.

As illustrated in FIG. 5A, a starting substrate (1a) is prepared that includes an insulating layer, which has a thickness of 1000 µm or more and 2000 µm or less and is to become the insulating layer 3 of the wiring substrate 1, and metal foils 40, which are respectively laminated on both sides of the insulating layer. The insulating layer of the starting substrate (1a) is formed, for example, using an insulating resin such as an epoxy resin, and contains the reinforcing material 31 (see FIG. 1) formed of a glass fiber or the like.

Then, through holes (the third through holes 23) penetrating the starting substrate (1a) are formed. The third through holes 23 are formed at predetermined positions where the second interlayer connection conductors are to be formed. The third through holes 23 are formed, for example, by laser processing, in which $CO_2$ laser is irradiated, or by drilling or the like. A spot diameter of a laser beam or a drill diameter is selected such that the third through holes 23 to be formed have a predetermined inner diameter, for example, an inner diameter of 350 µm or more and 450 µm or less.

Figure 5B:
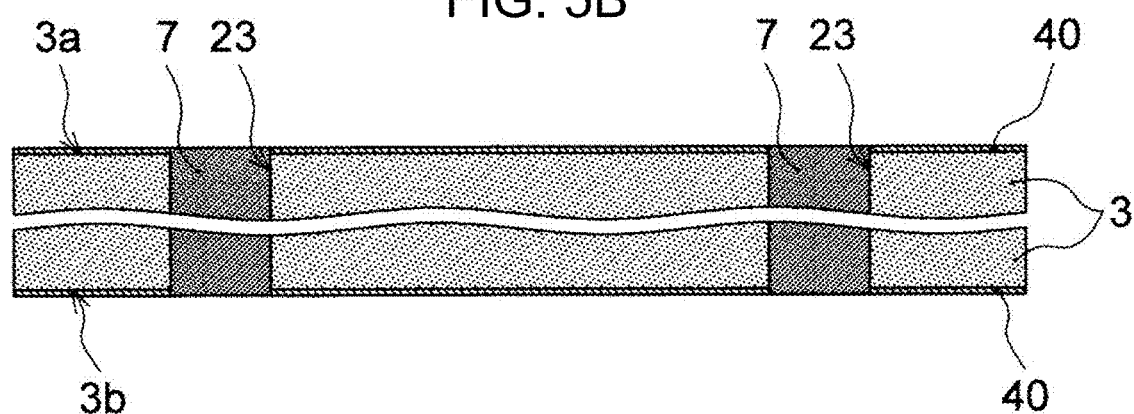
FIG. 5B is a cross-sectional view illustrating an example of a manufacturing process of a wiring substrate according to the embodiment of the present invention.

As illustrated in FIG. 5B, the third through holes 23 are filled with the magnetic bodies 7. Inner wall surfaces of the third through holes 23 are covered by the magnetic bodies 7. For example, an epoxy resin or an urethane resin containing particles formed of a ferromagnetic material such as iron, iron oxide, or cobalt is injected from either or both of the first surface (3a) side and the second surface (3b) side (which is on the opposite side with respect to the first surface (3a) side) of the insulating layer 3. When necessary, an epoxy resin or the like supplied from one of the first surface (3a) side and the second surface (3b) side may be sucked from the other side through the third through holes 23. The resin containing the magnetic material injected into the third through holes 23 is solidified by heating when necessary. As a result, the magnetic bodies 7 that fill the third through holes 23 are formed.

End surfaces of the magnetic bodies 7 on the first surface (3a) side and the second surface (3b) side of the insulating layer 3 are polished using any method such as chemical mechanical polishing, when necessary. It is preferable that the end surfaces of the magnetic bodies 7 on both sides are respectively substantially flush with a surface of the metal foil 40 on the first surface (3a) and a surface of the metal foil 40 on the second surface (3b).

Figure 5C:
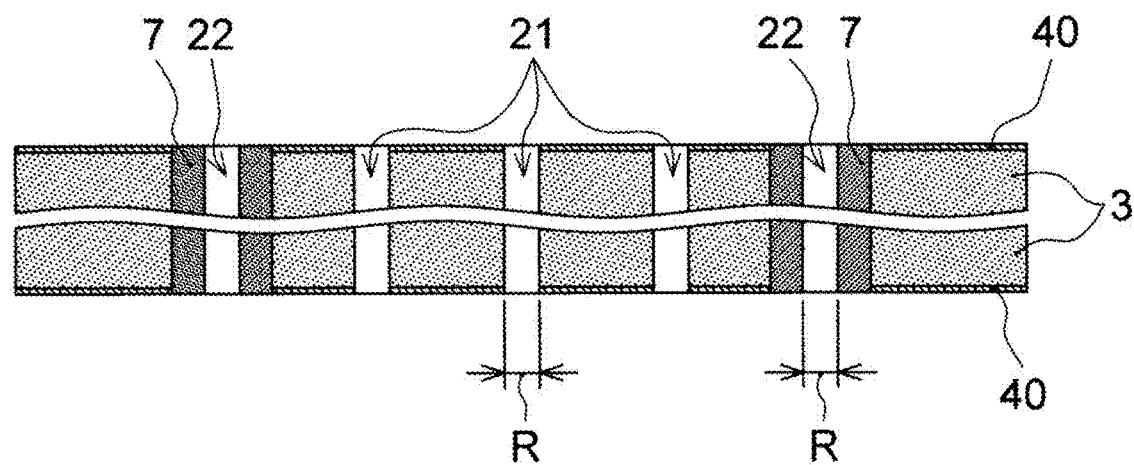
FIG. 5C is a cross-sectional view illustrating an example of a manufacturing process of a wiring substrate according to the embodiment of the present invention.

As illustrated in FIG. 5C, the first through holes 21 and the second through holes 22 are formed. The first through holes 21 are respectively formed at predetermined positions where the first interlayer connection conductors are to be formed. The second through holes 22 are respectively formed at predetermined positions where the second interlayer connection conductors are to be formed, that is, at positions penetrating the magnetic bodies 7 in the third through holes 23.

Similar to the third through holes 23, the first and second through holes (21, 22) are formed, for example, by laser processing using $CO_2$ laser, or by drilling or the like. A spot diameter of a laser beam or a drill diameter is selected such that the first through holes 21 and the second through holes 22 to be formed have a predetermined inner diameter, for example, an inner diameter of 120 µm or more and 190 µm or less.

Figure 5D:
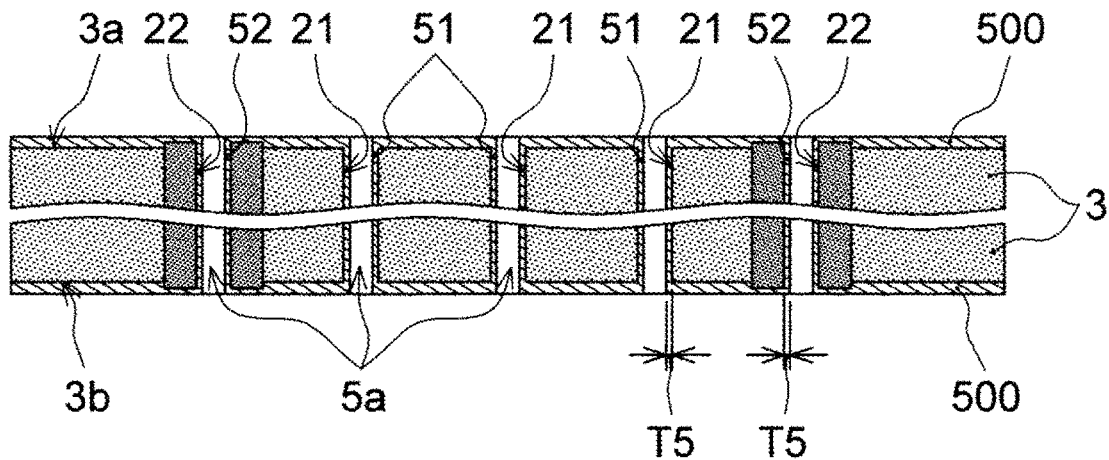
FIG. 5D is a cross-sectional view illustrating an example of a manufacturing process of a wiring substrate according to the embodiment of the present invention.

As illustrated in FIG. 5D, the first interlayer connection conductors 51 and the second interlayer connection conductors 52 are respectively formed in the first through holes 21 and the second through holes 22. In FIG. 5D, the illustration of the interlayer connection conductors (51, 52) is simplified. However, the first metal film 501 and the second metal film 502 described above (see FIGS. 3A and 3B) are formed on the inner wall surfaces of the first and second through holes (21, 22). As a result, the first interlayer connection conductors 51 and the second interlayer connection conductors 52 are formed each including two layers of metal films. The first and second metal films (501, 502) are also formed on the first surface (3a) and the second surface (3b) of the insulating layer 3, and a metal layer 500 having a three-layer structure including the metal foil 40 of FIG. 5C is formed on each of the first surface (3a) and the second surface (3b).

The metal films forming the interlayer connection conductors (51, 52) are each formed by, for example, sputtering, electroless plating, or electrolytic plating. Conditions for electroless plating and electrolytic plating are adjusted such that the volume occupancy rate of the interlayer connection conductors (51, 52) in the first through holes 21 or the second through holes 22 is 45% or more and 70% or less. As a result, the hollow parts (5a) are formed having a volume occupancy rate of 30% or more and 55% or less in the first through holes 21 or the second through holes 22. The conditions of electroless plating and electrolytic plating may be adjusted such that the thickness (T5) of the metal films forming the interlayer connection conductors (51, 52) is, for example, 25 μm or more and 40 μm or less. The interlayer connection conductors (51, 52) are each formed of, for example, a metal such as copper or nickel.

Figure 5E:
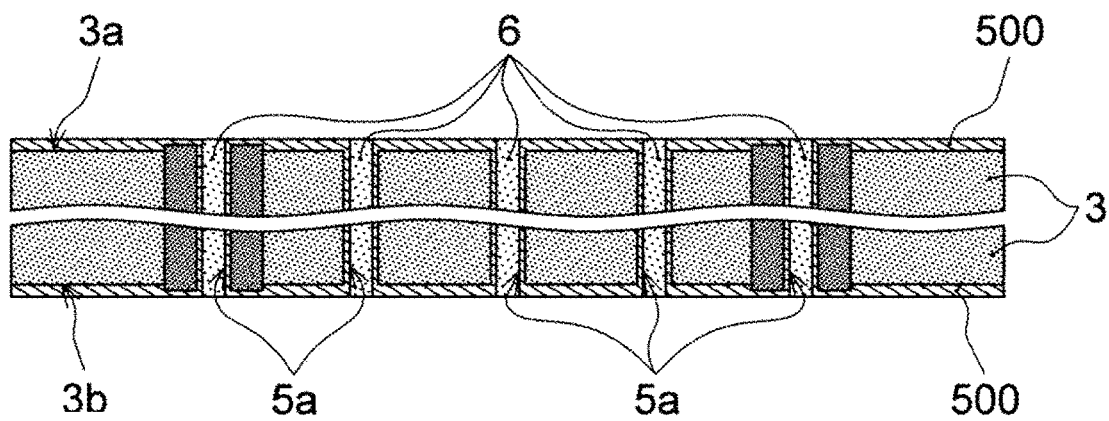
FIG. 5E is a cross-sectional view illustrating an example of a manufacturing process of a wiring substrate according to the embodiment of the present invention.

As illustrated in FIG. 5E, the hollow parts (5a) are filled with the resin bodies 6. For example, a resin such as epoxy, acrylic or phenol is injected into the hollow parts (5a) from either or both of the first surface (3a) side and the second surface (3b) side of the insulating layer 3. When necessary, an epoxy resin or the like supplied from one of the first surface (3a) side and the second surface (3b) side may be sucked from the other side. The resin injected into the hollow parts (5a) is solidified by heating or the like when necessary. As a result, the resin bodies 6 are formed.

When necessary, the end surfaces of the resin bodies 6 on the first surface (3a) side and on the second surface (3b) side are polished using any method such as chemical mechanical polishing. It is preferable that the end surfaces of the resin bodies 6 on both sides are respectively substantially flush with a surface of the metal layer 500 on the first surface (3a) side and a surface of the metal layer 500 on the second surface (3b) side.

Figure 5F:
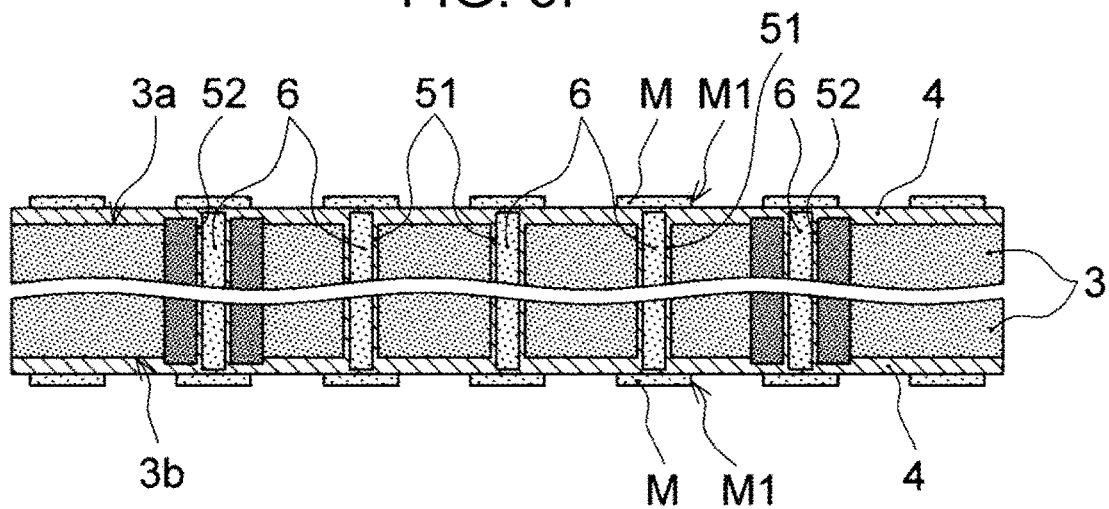
FIG. 5F is a cross-sectional view illustrating an example of a manufacturing process of a wiring substrate according to the embodiment of the present invention.

As illustrated in FIG. 5F, the conductor layers 4 are respectively formed on the first surface (3a) and on the second surface (3b) of the insulating layer 3. Specifically, the third metal film 43 and the fourth metal film 44 (see FIGS. 3A and 3B) described above are formed on the metal layers 500 and on the resin bodies 6 of FIG. 5E by, for example, sputtering, electroless plating, or electrolytic plating. So-called lid plating films are formed on the first and second interlayer connection conductors (51, 52). As a result, the conductor layers 4 that each can have a five-layer structure are formed. After that, etching masks (M) having openings (M1) corresponding to conductor patterns to be formed in the conductor layers 4 are respectively formed on the conductor layers 4.

Figure 5G:
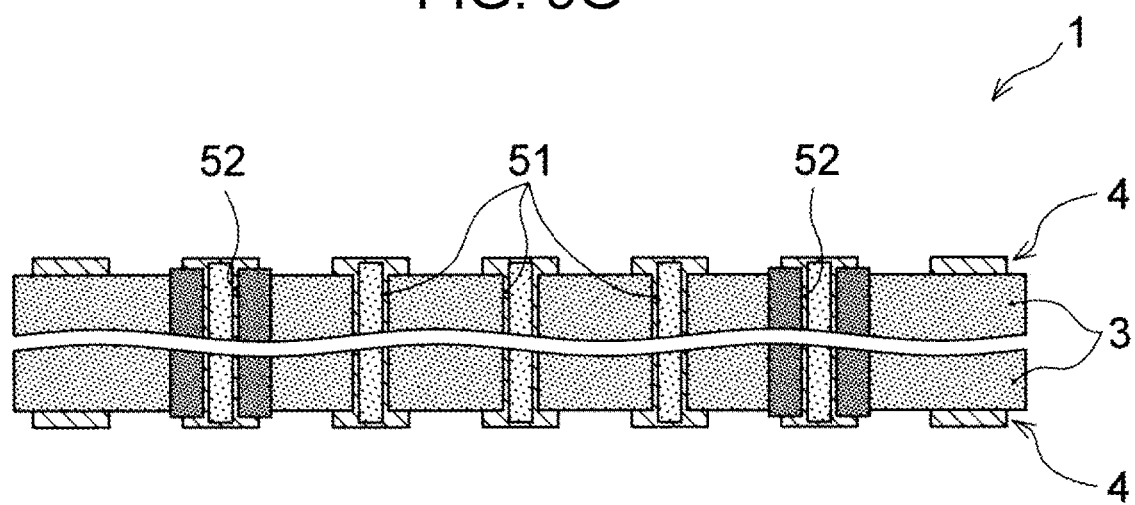
FIG. 5G is a cross-sectional view illustrating an example of a manufacturing process of a wiring substrate according to the embodiment of the present invention.

As illustrated in FIG. 5G, the conductor layers 4 are patterned. Unwanted portions of the conductor layers 4 are removed by wet etching or dry etching. As a result, the wiring substrate 1 having the interlayer connection conductors (51, 52) illustrated in FIG. 1 is completed.

The wiring substrate 10 illustrated in FIG. 4 referenced above is formed by forming the build-up layer 12 on one side of the wiring substrate 1 in the state of FIG. 5G and forming the build-up layer 13 on the other side of the wiring substrate 1. The build-up layers (12, 13) can each be formed, for example, by repeating formation of an insulating layer by laminating a film-like epoxy resin or a prepreg or the like, and formation of a conductor layer and via conductors using any method such as an additive method or a subtractive method.

The wiring substrate of the embodiment is not limited to those having the structures illustrated in the drawings and those having the structures, shapes, and materials exemplified in the present specification. As described above, the wiring substrate of the embodiment can have any laminated structure. The wiring substrate of the embodiment can include any number of conductor layers and any number of insulating layers.

In energization between the wiring conductors via the through hole filled with a non-conductive material such as a resin described in Japanese Patent Application Laid-Open Publication No. 2014-39073, an excessive voltage drop or heat generation may occur in the through hole. Therefore, it may be possible that desired characteristics are not obtained in a device using the wiring substrate.

A wiring substrate according to an embodiment of the present invention includes: an insulating layer; two conductor layers that oppose each other via the insulating layer; at least one interlayer connection conductor that is formed in a through hole penetrating the insulating layer along a thickness direction of the insulating layer and connects the two conductor layers to each other; and a resin body that fills in the through hole. The at least one interlayer connection conductor has a length of 1000 μm or more and 2000 μm or less in the thickness direction, a volume occupancy rate of the at least one interlayer connection conductor in the through hole is 45% or more and 70% or less, and a volume occupancy rate of the resin body in the through hole is 30% or more and 55% or less.

According to an embodiment of the present invention, it may be possible that a current rating of the interlayer connection conductor formed in the through hole filled with the resin body can be increased as compared to a conventional case.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
an insulating layer having a through hole;
a first conductor layer formed on a first surface of the insulating layer;
a second conductor layer formed on a second surface of the insulating layer on an opposite side with respect to the first surface of the insulating layer;
a magnetic body penetrating through the insulating layer along a thickness direction of the insulating layer such that the through hole is formed through the magnetic body; and
an inductor comprising an interlayer connection conductor formed in the through hole and penetrating through the magnetic body such that the interlayer connection conductor is connecting the first and second conductor layers, and a resin body formed in the through hole of the insulating layer such that a volume occupancy rate of the resin body is in a range of 30% to 55% in the through hole,
wherein the interlayer connection conductor of the inductor is formed such that the interlayer connection conductor has a length in a range of 1000 μm to 2000 μm in the thickness direction of the insulating layer and that a volume occupancy rate of the interlayer connection conductor is in a range of 45% to 70% in the through hole.

2. The wiring substrate according to claim 1, wherein the interlayer connection conductor is formed such that the volume occupancy rate of the interlayer connection conductor is 50% or more in the through hole.

3. The wiring substrate according to claim 2, wherein the insulating layer is formed such that the through hole has an inner diameter in a range of 120 μm to 190 μm.

4. The wiring substrate according to claim 2, wherein the interlayer connection conductor includes a metal film formed on an inner wall of the through hole such that the metal film has a thickness in a range of 25 μm to 40 μm.

5. The wiring substrate according to claim 2, wherein the interlayer connection conductor is formed in the through hole such that the interlayer connection conductor is forming a hollow part penetrating through the interlayer connection conductor along the thickness direction and that the resin body is filling the hollow part of the interlayer connection conductor.

6. The wiring substrate according to claim 2, wherein the magnetic body is formed such that the magnetic body has a width in a range of 350 μm to 450 μm.

7. The wiring substrate according to claim 2, wherein the interlayer connection conductor is formed in a plurality such that the plurality of interlayer connection conductors includes an interlayer connection conductor having a side surface covered by the magnetic body and an interlayer connection conductor having a side surface covered by the insulating layer.

8. The wiring substrate according to claim 2, wherein the interlayer connection conductor is integrally formed with the first and second conductor layers.

9. The wiring substrate according to claim 2, further comprising:
a build-up layer comprising a plurality of insulating layers and a conductor layer,
wherein the build-up layer is laminated on a core substrate comprising the insulating layer having the through hole, and the first and second conductor layers formed on the insulating layer having the through hole.

10. The wiring substrate according to claim 1, wherein the insulating layer is formed such that the through hole has an inner diameter in a range of 120 μm to 190 μm.

11. The wiring substrate according to claim 10, wherein the interlayer connection conductor includes a metal film formed on an inner wall of the through hole such that the metal film has a thickness in a range of 25 μm to 40 μm.

12. The wiring substrate according to claim 10, wherein the interlayer connection conductor is formed in the through hole such that the interlayer connection conductor is forming a hollow part penetrating through the interlayer connection conductor along the thickness direction and that the resin body is filling the hollow part of the interlayer connection conductor.

13. The wiring substrate according to claim 10, wherein the magnetic body is formed such that the magnetic body has a width in a range of 350 μm to 450 μm.

14. The wiring substrate according to claim 10, wherein the interlayer connection conductor is formed in a plurality such that the plurality of interlayer connection conductors includes an interlayer connection conductor having a side surface covered by the magnetic body and an interlayer connection conductor having a side surface covered by the insulating layer.

15. The wiring substrate according to claim 1, wherein the interlayer connection conductor includes a metal film formed on an inner wall of the through hole such that the metal film has a thickness in a range of 25 μm to 40 μm.

16. The wiring substrate according to claim 1, wherein the interlayer connection conductor is formed in the through hole such that the interlayer connection conductor is forming a hollow part penetrating through the interlayer connection conductor along the thickness direction and that the resin body is filling the hollow part of the interlayer connection conductor.

17. The wiring substrate according to claim 1, wherein the magnetic body is formed such that the magnetic body has a width in a range of 350 μm to 450 μm.

18. The wiring substrate according to claim 1, wherein the interlayer connection conductor is formed in a plurality such that the plurality of interlayer connection conductors includes an interlayer connection conductor having a side surface covered by the magnetic body and an interlayer connection conductor having a side surface covered by the insulating layer.

19. The wiring substrate according to claim 1, wherein the interlayer connection conductor is integrally formed with the first and second conductor layers.

20. The wiring substrate according to claim 1, further comprising:
a build-up layer comprising a plurality of insulating layers and a conductor layer,
wherein the build-up layer is laminated on a core substrate comprising the insulating layer having the through hole, and the first and second conductor layers formed on the insulating layer having the through hole.

* * * * *